United States Patent [19]

Zwaans

[11] Patent Number: 5,568,494

[45] Date of Patent: Oct. 22, 1996

[54] ENCODING OR DECODING DEVICE COMPRISING A PAGED MEMORY

[75] Inventor: Bernardus A. M. Zwaans, Eindhoven, Netherlands

[73] Assignee: U.S. Philips Corporation, New York, N.Y.

[21] Appl. No.: 353,837

[22] Filed: Dec. 12, 1994

[30] Foreign Application Priority Data

Dec. 16, 1993 [EP] European Pat. Off. .............. 93203545

[51] Int. Cl.$^6$ .................................................. G11C 29/00
[52] U.S. Cl. ................................ 371/40.1; 395/182.04
[58] Field of Search .................... 371/37.1, 40.1, 371/37.4, 37.5, 40.2; 395/425, 182.04, 445

[56] References Cited

U.S. PATENT DOCUMENTS

| | | | |
|---|---|---|---|
| 4,675,870 | 6/1987 | Baggen | 371/37.1 |
| 5,155,826 | 10/1992 | Fadem | 395/425 |
| 5,469,448 | 11/1995 | Denissen et al. | 371/37.4 |

FOREIGN PATENT DOCUMENTS

0553515  8/1993  European Pat. Off. ......... H04N 5/94

*Primary Examiner*—Roy N. Envall, Jr.
*Assistant Examiner*—Karen D. Presley
*Attorney, Agent, or Firm*—Anne E. Barschall

[57] ABSTRACT

First blocks with data units are encoded or decoded in a first error protection code in an encoding or decoding device. A sub-set of data units, comprising one data unit from each first block, is encoded or decoded in a second block of the second error protection code. The data units of each first block are stored so as to be group-wise distributed among different pages of a paged memory. On each page data units from different first blocks are stored, so that upon reading of the data units of the sub-set the data units can also be written again so as to be group-wise distributed among different pages. The number of necessary page address changes is thus minimized.

13 Claims, 4 Drawing Sheets

ENCODING OR DECODING DEVICE COMPRISING A PAGED MEMORY

BACKGROUND OF THE INVENTION

1. Field of the Invention

The invention relates to an encoding device, comprising a first encoder for forming respective first blocks in a first error protection code, a memory for the storage of data units of the first blocks, read means for reading a sub-set of the data units, comprising one data unit from each first block, from the memory, and a second encoder for forming a second block in a second error protection code by encoding the sub-set.

The invention also relates to a decoding device, comprising a first decoder for decoding respective first blocks in accordance with a first error correction code, a memory for the storage of data units of the first blocks, read means for reading a sub-set of the data units, comprising one data unit from each first block, from the memory, and a second decoder for decoding the subset in accordance with a second error correction code.

The invention also relates to a control device for such an encoding or decoding device. An encoding and decoding device of this kind are known from EP 553.515 A (PHN 13.928).

2. Description of the Related Art

The use of an error protection code enables detection and correction of a limited number of incorrect data units in a block. Large numbers of errors, for example so-called burst errors where a number of successive data units are incorrect, cannot be corrected in this manner.

In order to enable correction of burst errors nevertheless, it is known to utilize a so-called product code in which the data is subjected to a first and a second code in such a manner that per block of the second code at the most one data unit of each block of the first code occurs. A burst error in a single block of the first code then corresponds to a single incorrect data unit in a number of blocks of the second code. These errors can be simply corrected by means of the second code.

For the composition of the second blocks it is necessary to collect the data units from a number of first blocks in a memory. This memory must be comparatively large; in the case of digital video recording, for example a memory for more than 100 Kilobytes is required as described in the cited Patent Specification.

Because they have a large capacity, it is advantageous to utilize commercially available DRAMs (dynamic random access memories) for this purpose. The addressing of memory locations in DRAMs requires two address cycles: one to indicate an address of a page, and one to indicate an address within this page. Encoding and decoding of the data units, therefore, is rather time-consuming.

SUMMARY OF THE INVENTION

It is inter alia an object of the invention to provide a fast encoder and decoder.

To this end, the encoding device and decoding device in accordance with the invention are characterized in that the memory is page oriented, successive accessing of different locations on the same page requiring only a single page addressing operation, the encoding device being arranged for writing data units of a particular first block in the memory distributed among several pages, at least two data units of the particular first block being written on one and the same page on the basis of a first, single page addressing operation, writing further data units of further first blocks also distributed among the several pages, the read means being arranged for reading the data units of the sub-set successively from different pages, at least two data units then being read on the basis of a second, single page addressing operation.

During writing and reading, the page address thus changes each time only after the writing or reading of several data units stored together in a part. Therefore, fewer page addressing cycles need be executed. Writing and reading are thus less time-consuming so that the device is faster.

The number of page addressing cycles required for writing or reading is minimum when an as large as possible number of data units from a first block or a second block is stored on the same page.

However, it has been found that the total number of page addressing cycles required upon writing and reading together, is minimized only if the number of data units from a first block which are successively written on the same page is less than the maximum number that can be accommodated on the page. Thus, space is reserved for writing more data units which belong to the same second block (but originate from different first blocks) on the page. Consequently, more data units can be successively read from the same page during a read operation.

Conversely, a similar limitation exists as regards the maximum number of data units from the same second block read from one page. The exact numbers of data units per page so as to achieve a minimum number of page addressing cycles are dependent on the numbers of data units contained in the first and second blocks and on the number of data units that can be simultaneously stored on a page.

An embodiment of the encoding device and decoding device in accordance with the invention, in which the at least two data units read by the read means on the basis of a second, single page addressing operation are associated at least with a first and a second one of the first blocks, respectively, is characterized in that the read means are arranged to read a further sub-set which is disjunct with the sub-set and contains one data unit from each first block, at least two further data units from at least the first and the second one of the first blocks, respectively, being read on the basis of said second, single page addressing operation, the second encoder or decoder being arranged to encode and decode the sub-set, respectively, according to a second error correction code.

Data units intended for different sub-sets can thus be read from the same page at different instants. The sequence of the page addresses may then be the same during the formation of the various sub-sets.

The invention relates not only to the encoding and decoding of product codes, but also to other codes where each sub-set is composed from a slightly different first set of blocks. When product codes are used, a set of first blocks remains essentially unchanged until a number of second blocks has been formed. Subsequently, the set as a whole is replaced.

An embodiment of the encoding and decoding device in accordance with the invention is characterized in that it is arranged to leave the first one of the first blocks essentially unchanged between the reading of the sub-set and of the further sub-set and to replace the data units of the second one of the first blocks on the page addressed by the second page address by data units of a newly formed first block. The set of first blocks can thus be gradually replaced and each second block can be formed from a slightly different set, for example when convolution codes are used.

An embodiment of the encoding and decoding device in accordance with the invention is characterized in that the write means comprise first and second counting means for counting a first block number and a data unit number, respectively, of a data unit to be written within a first block, least-significant parts of counts of the first and the second counting means serving as an intrapage address and most-significant parts of the counts serving as a page address for the memory. The distribution of the parts of the blocks among different pages is thus realised by means of counting means such as a digital counting circuit or a processor executing counting instructions.

An embodiment of the encoding and decoding device in accordance with the invention is characterized in that it is arranged to make a selection between a first location and a second location on the same page in order to write each data unit of each first block, so that a last preceding, error-free, corresponding first block remains accessible in the first or the second location. In this respect see EP 553.515 (PHN 13.928) which is incorporated herein by way of reference and which discloses why and how the location is rendered dependent on the error occurring. By keeping the choice of alternative locations within a page, the number of page addressing operations required is kept small.

These and other advantageous aspects of the invention will be described with reference to the Figures.

DESCRIPTION OF THE PREFERRED EMBODIMENTS

Figure 1:
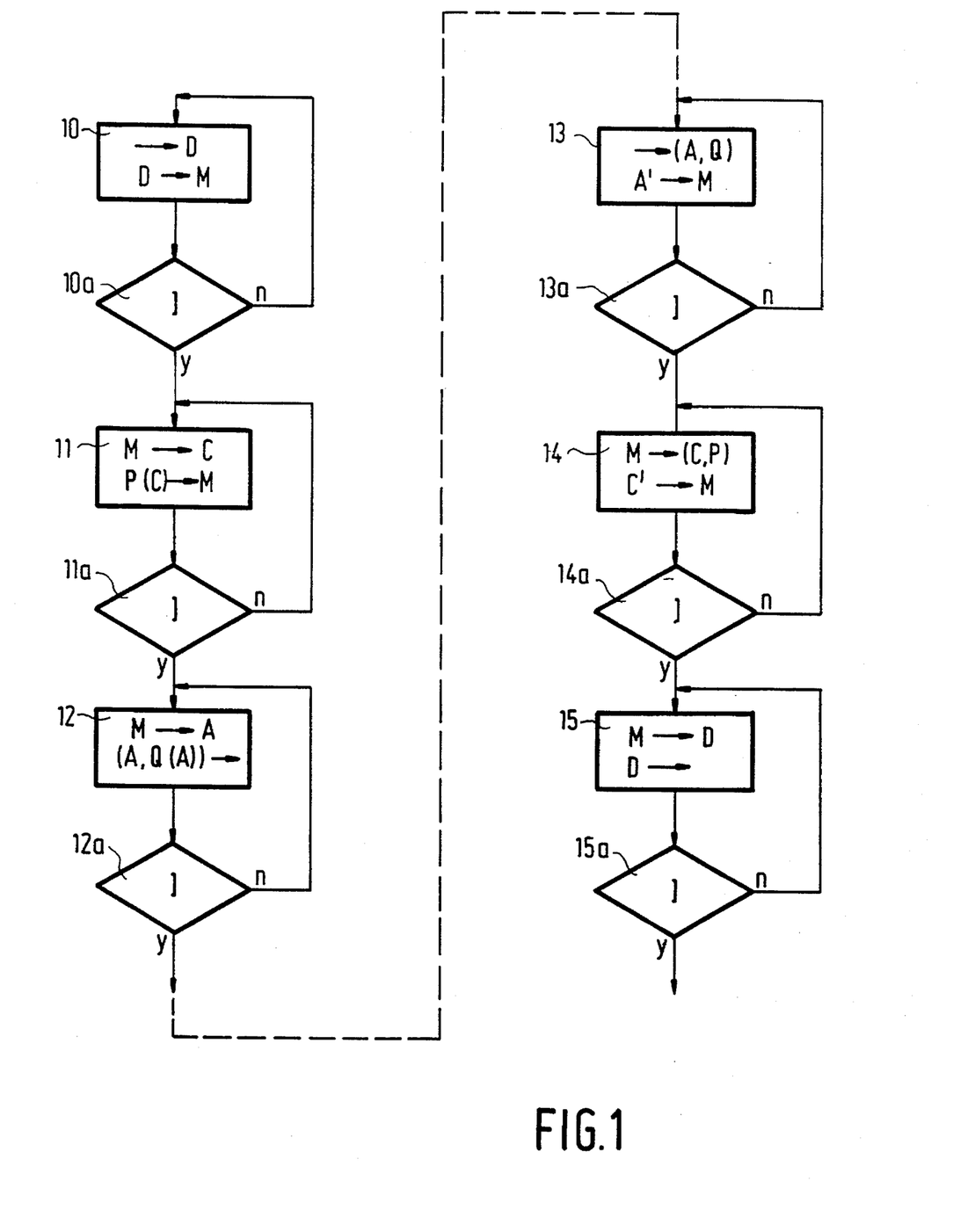
FIG. 1 shows a flow chart for the encoding and decoding of data units.

FIG. 1 shows a flow chart for the encoding and decoding of a series of data segments. FIG. 1 is intended notably to indicate during which steps data units must be written or read in a memory.

Encoding commences with a first step 10 in which the data units D of a series of segments, for example containing video information, are received (symbolized by →D) and written into the memory (D→M). The first step 10 is repeated for a number of segments in a repetition loop 10, 10a until enough segments have been written so as to start encoding (the symbol "]" in the step 10a symbolizes the question whether the number of segments is sufficient; output "n" of block 10a is retrocoupled if the number is insufficient).

During the second step 11 data units C are read from the memory (symbolized by M→C) in order to form first blocks of data units. One or more parity symbols P(C) are added to the data units C of each block read and written into the memory (P(C)→M). The second step 11 is repeated in a repetition loop 11, 11a for a number of first blocks until enough first blocks have been processed (as determined in the block 11a).

During a third step 12 the data units A are read from the memory (M→A) in order to form second blocks of data units. For the formation of each second block no more than one data unit is read from each first block. For the data units A read in order to form the second block there is formed a parity symbol Q(A) which is despatched together with the data units read ((A,Q)→). This step is also included in a repetition loop 12, 12a. The third step 12 is repeated for a number of second blocks in a repetition loop 12, 12a until enough second blocks have been processed (as determined in the block 12a).

As is shown, FIG. 1 concerns the encoding of a product code. This is not the sole application. During the encoding of other types of code, for example convolution codes, the steps 10, 11, 12 are executed each time for a single first or second block after which, in the case of the step 10, 11, the respective next step 11, 12 is executed and, in the case of the step 12, the first step 10 is executed again. Between successive executions of the second step 12 each time one block is thus replaced in the sets of blocks wherefrom a parity symbol is determined during the second step 11.

The algorithm for forming the parity symbols per se is not the subject of the present invention. For this purpose, use can be made of known techniques, for example as described in R. E. Blahut: "Theory and practice of error control codes", 1983, Addison Wesley publishing company, and N. Glover and T. Dudley: "Practical error correction for engineers" 1982, Data systems technology Corporation, Broomfield Colo. Furthermore, the invention can also be used in combination with non-systematic codes, i.e. codes in which each block is encoded as a whole and hence no explicit parity symbols are formed.

The encoded data units (A,Q) are stored, for example on a magnetic tape and are read again for decoding at a later stage. Thanks to the parity symbols, transfer errors can then be corrected in conformity with the techniques disclosed in the cited book by Blahut.

In FIG. 1 the decoding operation is represented mainly as the reverse of the encoding operation. Again there are three repeated steps 13, 14, 15, involving writing into (A'→M, C'→M) and reading from (M→(C,P), M→D) the memory. During the first step 13 the data units with parity symbols are received (→(A,Q)) and the data units received are written, corrected if necessary, into the memory (A'→M). During the second step 14, corrections C' for data units containing an error are written into the memory during decoding. This takes the place of the writing of parity symbols as in the second step of the encoding operation. During the third step data units are read and despatched (D→), for example for display as a video image.

When codes other than product codes are used, the steps 13, 14, 15 are executed each time for a single block, as during the encoding operation (steps 10, 11, 12), after which the next step is executed. In this case it may be necessary to transfer blocks with parity codes "out of sequence" with respect to the other blocks between the encoder and the decoder.

In the case of digital video recording (DVC), the blocks are rather large. For example, each first block contains 88 bytes (7 of which are parity symbols) and each second block contains 128 bytes. Furthermore, 12 tracks are written and read in parallel on a magnetic tape so as to be independently encoded and decoded simultaneously, so that each time 12×128×88 bytes must be stored together in the memory.

In accordance with the invention, use is made of a memory which is organized in pages, for example a DRAM. When such a memory is used, it is not necessary to present each time a new page address when a plurality of data units are read from the same page or written onto the same page without interruption for other pages. The omission of page addresses enables faster addressing of the memory.

In accordance with the invention, the required number of new page addresses is reduced by splitting the data units of a data block into sub-blocks comprising several data units each. Each sub-block is written onto or read from a different page.

Figure 2A:
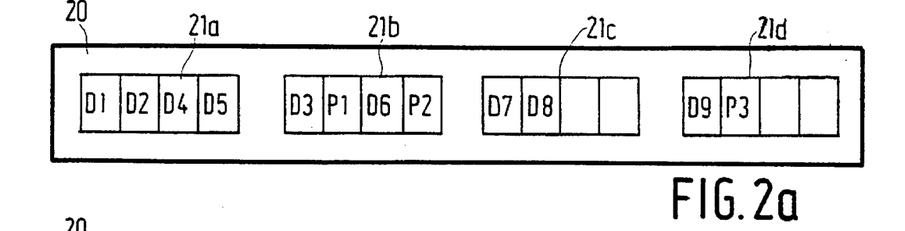
FIG. 2a illustrates the writing according to a first step of FIG. 1.
Figure 2B:
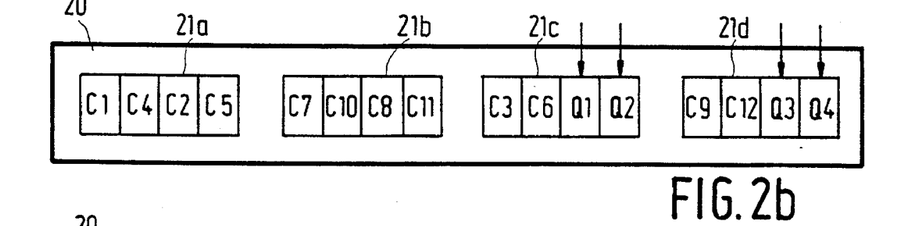
FIG. 2b illustrates the reading and writing according to a second step of FIG. 1.
Figure 2C:
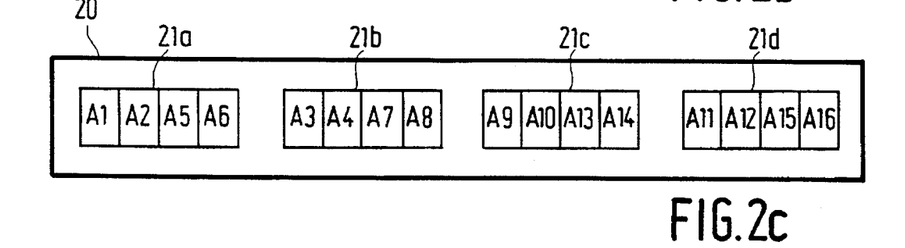
FIG. 2c illustrates the reading according to a third step of FIG. 1.

FIGS. 2a–c show a simple example in this respect. Each of these Figures shows a memory 20 with four pages 21a–d, each of which contains four locations. The example is based on a series of three segments of four data units each. During encoding, first blocks of four data units are formed, one of which is a parity symbol. The second blocks contain five data units, including one parity symbol.

FIG. 2a illustrates the writing according to the first step 10 of FIG. 1. In each respective location of the memory 20 the data unit to be written therein is indicated. The data units are denoted by D1–12, i.e. numbered in the sequence in which they are written into the memory 20. When a product code is used, this is also the sequence of their arrival at the encoder. Without departing from the scope of the invention, however, the data units may be numbered in a sequence other than the sequence of their arrival. The numbering sequence may even be different for different blocks; this is the case, for example in the event of pseudo-product codes.

As is shown in FIG. 2a, each time two data units D1-2, D3-4, D5-6, D7-8, D9-10, D11-12 are written onto one page 21a–d in direct succession before the page is changed. To this end, each time only one page address need be supplied for two data units. However, the page is not filled in one operation. Space is reserved which, as will appear hereinafter, is used to ensure that data units from several blocks are stored per page 21a–d. The advantage thereof will become apparent from the description given with reference to FIG. 2b.

FIG. 2b illustrates the reading and writing in conformity with the second step 11 of FIG. 1. In each respective location of the memory 20 the data unit to be read from this location is indicated. The data units are denoted by C1–12, i.e. numbered in the sequence in which they are read from the memory 20. The data units C1–12 are subdivided into four groups C1-3, C4-6, C7-9, C10-12. A respective data unit is added as a parity symbol P1-4 to each group so as to be written into the memory (numbered in the sequence of the associated groups and denoted by incoming arrows in FIG. 2a). Each parity symbol P1-3 is written in after the reading of the data units of the associated segment P1:C1-3, P2:C4-6, P3:C7-9, P4:C10-12.

As appears from FIG. 2b, each time two data units C1-2, (C3,P1), C4-5, (C6,P2), C7-8, (C9,P3), C10-11, (C12,P4) of a first block are written or read in direct succession on one page 21a–d. To this end, each time only one page address need be supplied for two data units.

Each first block (C1-3,P1), (C4-6,P2), (C7-9,P3), (C10-12,P4) is read or written so as to be distributed among several pages 21a–d. A page 21a–d is never filled or read completely in one operation. The space remaining is used to store data units from several first blocks per page 21a–d.

FIG. 2c illustrates the reading in conformity with the third step 12 of FIG. 1. In each respective location of the memory 20 the data unit read therefrom is indicated, denoted by A1-16 and numbered in the sequence of reading from the memory 20. The data units A1-16 are subdivided into four second blocks of four data units each. To each block there is added a parity symbol Q1-3. The second blocks (A1-4,Q1), (A5-8,Q2), (A9-13,Q3), (A13-16,Q4) with the data units and the associated parity symbols are successively despatched.

As appears from a comparison of the read locations in the FIGS. 2b and 2c, the data units in each first block (C1-3,P1), (C4-6,P2), (C7-9,P3), (C10-12,P4) originate from different second blocks A1-4, A5-8, A9-12, A13-16. This serves for protection against burst errors.

As is also apparent from FIG. 2c, each time two data units A1-2, A3-4, A5-6, A7-8, A9-10, A11-12, A13-14, A15-16 of a second block are always read from one page 21a–d in direct succession. To this end, per two data units each time only one page address need be supplied. This is possible because data units from different blocks were read from a page during the second step 11 of the encoding operation.

The data units of each second block A1-4, A5-8, A9-12, A13-16 are read from several pages 21a–d in a distributed manner. As a result, a page 21a–d is never fully read in one operation. In the space remaining per page 21a–d data units of other first blocks are stored. During the second step 11 of the encoding operation this enables the successive reading, like in the foregoing description, of several data units of a first block from a page 21a–d while supplying only a single page address.

The use of the memory during the decoding steps strongly resembles that during encoding as described with reference to the FIGS. 2a–c, be it in the reverse order. The write sequence during the first decoding step 13 is as indicated in FIG. 2c. The read sequence during the second decoding step 14 is as indicated in FIG. 2b (in which the parity symbols P1-4 are read immediately after the data units C3, C6, C9, C12, respectively). After the reading of a block (C1-3,P1), (C4-6,P2), (C7-9,P3), (C10-12,P4), if necessary, data units (C') are written back for correction.

The third decoding step 15 utilizes the sequence as shown in FIG. 2a (reading P1-3 after D3, D6, D9, respectively), after which the data units D1-9 are output, corrected if necessary.

Decoding in this manner offers the same advantages as the encoding operation, be it that the writing back of corrected data units during the second encoding step introduces an ambiguous element. The additional time then required can be reduced by buffering errors to be corrected. When data units of further blocks are read from the memory, after some time a point will usually be reached where reading again takes place in the page containing the data unit to be corrected. By postponing the writing of corrections until that point, additional page addressing can be avoided in most cases.

Figure 3:
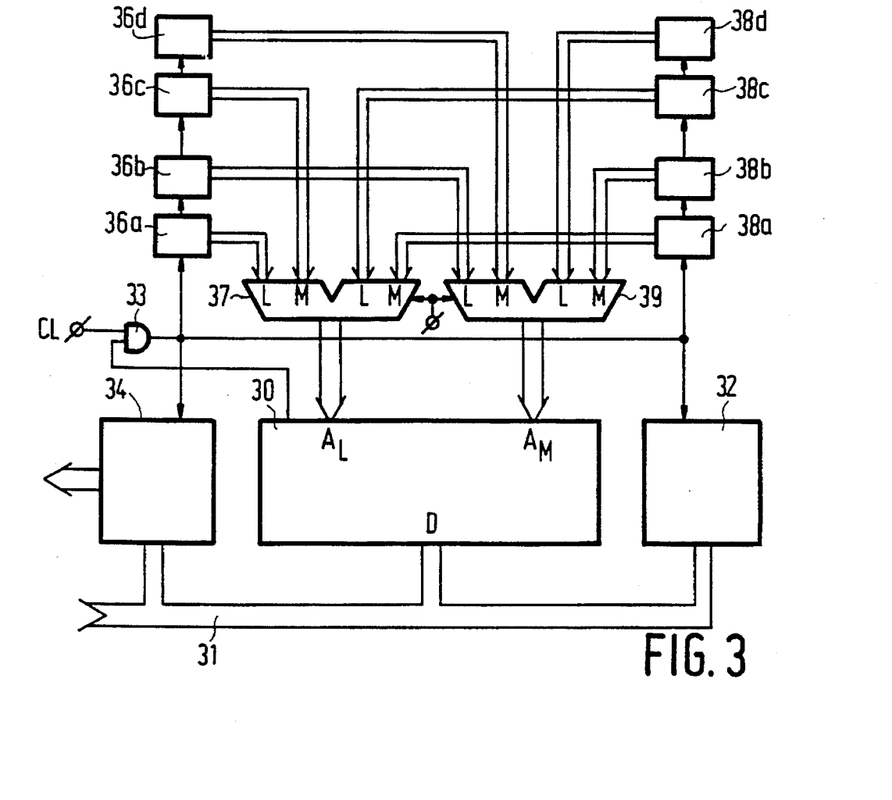
FIG. 3 shows a device for encoding in accordance with the invention.

FIG. 3 shows an encoding device in accordance with the invention. The Figure is drafted around a memory 30 and shows two encoders 32, 34 which are coupled to a data input D of the memory 30 via a bus 31. FIG. 3 also shows a clock input CL which is coupled, via an AND-gate 33, to the encoders 32, 34 and to a first and a second cascade of counters 36a–d, 38a–d. The outputs of the counters 36a–d, 38a–d are coupled to two multiplexers 37, 39. The outputs of the multiplexers 37, 39 are coupled to address inputs of the memory 30. The assembly is controlled by a control unit (not shown).

During operation first the counters 36a–d are reset by the control unit. Subsequently, during the first encoding step 10 data units are presented, via the bus 31, in response to successive clock pulses. These units are stored in the memory 30. The cascade of counters 36a–d counts the data units; a part of the counters, 36c–d, counts the number of the block and a part 36a–b counts the number of the data unit in the block. The count of this operation is available on the output of the counters 36a–d and is applied to the multiplexers 37, 39.

In the write mode the control input of the multiplexers is adjusted by the control unit so that the first cascade of counters 36a–d supplies the address for the memory 30. The address comprises a page address AM and an intrapage address AL, each of which comprises a least-significant part and a most-significant part. The successive counters 36a–d in the first cascade of counters supply:

36a the least-significant part of the intrapage address AL
36b the least-significant part of the page address AM
36c the most-significant part of the intrapage address AL
36d the most-significant part of the page address AM, respectively.

Additional addressing time is required whenever the page address AM changes. For the sake of simplicity it is assumed in FIG. 3 that the memory 30 then generates a signal and applies it to the AND-gate 31 so as to stop the clock pulses for as long as is necessary to carry out the change of page.

In practice changes of page can be detected on the basis of transitions of the least-significant bit of the count of the counter 36b which counts the most-significant part of the number of the data unit within the block. As soon as this bit changes, the page number changes. The block need not yet have been completed at that time (the block number counter 36c,d need not yet be incremented); each time only a part of a block is thus written on the same page. Data units belonging to different blocks and having numbers with the same most-significant pan (as counted by the counter 36b) are stored on the same page (in as far as the most-significant part of the block number, as counted by the counter 36b, is the same).

During execution of the second encoding step (FIGS. 1, 11) the first encoder 32 reads a respective data unit from the memory 30 in response to a series of clock pulses received via the bus 31. The encoder 32 forms one or more parity symbols from the data units received and writes these symbols into the memory 30. After initialization by the control unit, the cascade of counters 38a–d counts the data units and parity symbols read from the memory; a part of the counters 38c–d then counts the number of the block and a part 38a–b counts the number of the data unit or the parity symbol in the block (the numbers of the parity symbols succeed those of the data units read). The count of this operation is available on the output of the counters 38a–d and is applied to the multiplexers 37, 39.

In the read mode the control input of the multiplexers is adjusted by the control unit so that the second cascade of counters 38a–d supplies the address for the memory 30. The successive counters 38a–d in the second cascade of counters supply:

38a the most-significant part of the intrapage address AL
38b the most-significant pan of the page address AM
38c the least-significant part of the intrapage address AL
38d the least-significant part of the page address AM, respectively.

Additional addressing time is required whenever the page address AM changes. Changes of page can be detected in practice on the basis of transitions of the least-significant bit of the count of the counter 38b which counts the most-significant part of the number of the data unit within the block. As soon as this bit changes, the page number changes. The block need not yet have been fully read at that time (the block number counter 38c,d need not yet be incremented); each time only a part of a block is thus read on the same page. Data units belonging to different blocks and having numbers with the same most-significant part (as counted by the counter 38b) are read from the same page (in as far as the most-significant part of the block number, as counted by the counter 38b, is the same).

During the third encoding step 13 the second encoder 34 reads the data units from the memory 30 again, via the bus 31, substantially in the sequence in which they have been written originally. The first cascade of counters can again serve to count the addresses, the block number then extending slightly further than in the case of writing because of the parity symbols added during the second step; to this end, the control unit readjusts the maximum count of the counter 36a–b for the number of the data unit.

After the data units of a block have been received via the bus 31, the second encoder 34 determines the associated parity symbols and subsequently outputs the symbols, together with the data units, as a second block.

Figure 4:
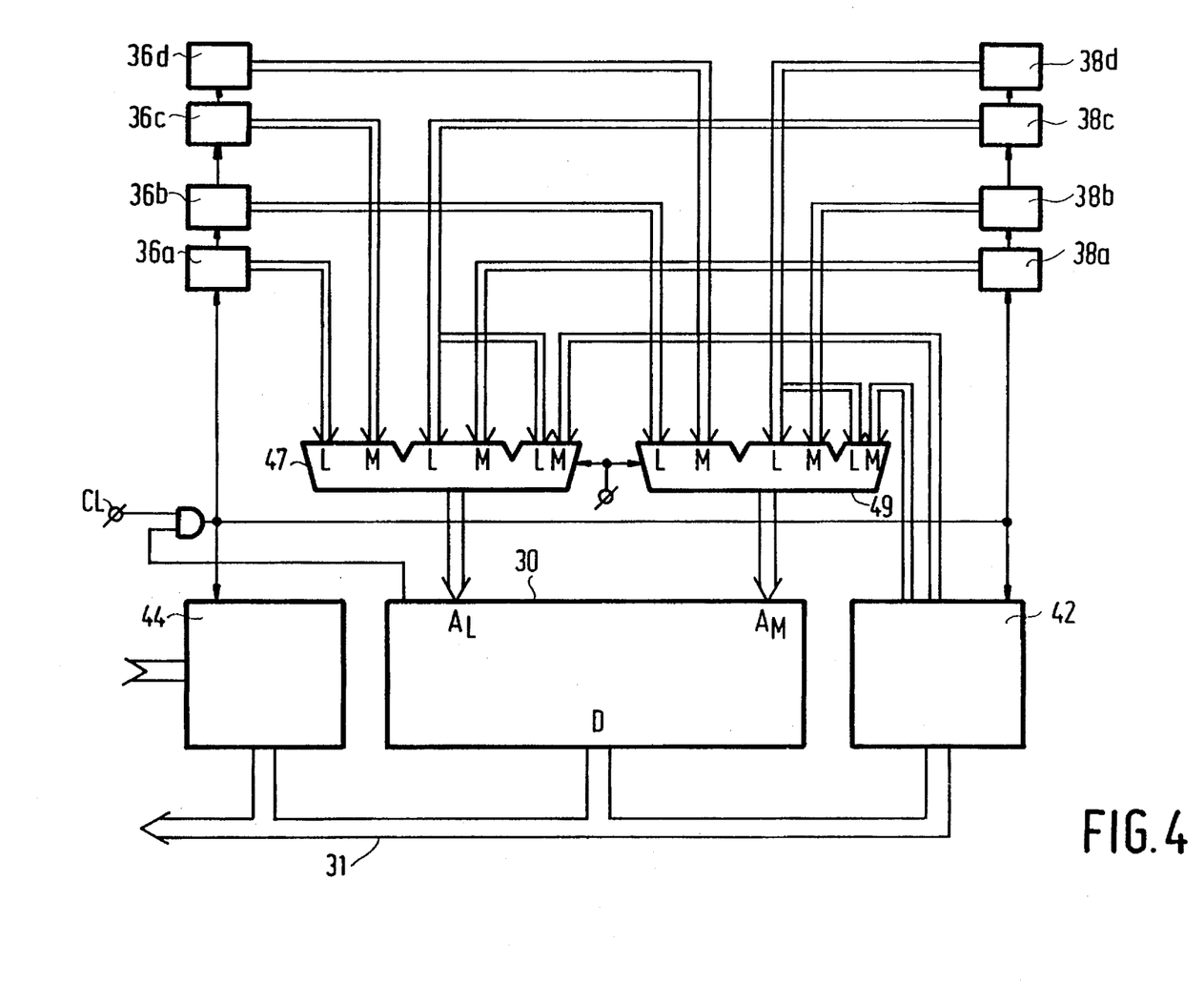
FIG. 4 shows a device for decoding in accordance with the invention.

FIG. 4 shows the decoding device. This device is substantially the same as that shown in FIG. 3, be it that the encoders 32, 34 have been replaced by decoders 42, 44. Furthermore, the first decoder 42 is coupled to the address input AL, AM of the memory via a further input of the multiplexers 47, 49.

The operation of the device shown in FIG. 4 also strongly resembles that of the device shown in FIG. 3, be it that the sequence of operations as described with reference to FIG. 1 is practically reversed. The differences consist in that the second decoder 44 receives blocks from the environment, corrects errors in these blocks, if necessary, on the basis of the parity symbols of the blocks, and writes the corrected blocks into the memory without the parity symbols used. Furthermore, after reception, the first decoder 42 reads blocks from the memory, together with the associated parity symbols. Subsequently, the first decoder 42 writes, if necessary, corrected data units at the addresses of data units which have been detected as being incorrect. To this end, the first decoder supplies, if necessary, the addresses of the data units to be corrected via the multiplexers 47, 49.

For the description of the FIGS. 3 and 4 it has been assumed that one data unit is stored in each memory location and that the data bus connection of the memory 30 transfers each time one data unit. This is not necessarily so; it is alternatively possible to store only a part of a data unit in each location, or to store several data units in each location. In the latter case it is also possible to write or read a plurality of data units simultaneously, thus increasing the speed. In this case a part of the least-significant part of the number of the data unit need not be counted: the counters 36a, 38a may be constructed so as to be smaller.

In order to enhance the error correction capability it is advantageous to render the address at which the data units are written into the memory 30 during decoding dependent on the occurrence of non-correctable errors. This is described per se in the cited Patent Application No. EP 553.515 (PHN 13.928).

This operation can be summarized as follows. Each time one frame comprising several blocks of data units is corrected. Each frame describes, for example an image of the same scene, so that the contents of corresponding blocks change hardly from one frame to another. It may occur that a block is deemed to be non-correctable, for example because it is found to contain too many errors. In that case it is replaced by a corresponding, error-tree block from a previous frame which, because of the insignificant change from one frame to another, represents a better approximation to the frame than the block containing too many errors.

In order to keep the most recent corresponding error-free block available during reading and writing, two alternative spaces are available in the memory 30 for each block arriving via the second encoder 44. In one of these blocks the most recent error-free block is stored; the newly arriving block is written into the other space. If the newly arriving block is found to be error-free, or if the block can be rendered error-free during decoding, this block will subsequently be treated as the last error-free block. If this is not the case, it is replaced by the next block in the same location in the frame.

If a first block for the first decoder 42 is found to be non-correctable, the decoder can write all data units of this first block into the memory 30 in erased form (for example, with the value 0), and inform the second decoder 44 that this first block has been erased. In that case the second decoder need no longer read the data units originating from these erased blocks. Therefore, it is not necessary to read incorrect data units from the memory again, notably for the determination of the corrected value of the data unit (correction-by-write instead of read-modify-write). The decoding speed is thus increased.

Figure 5:
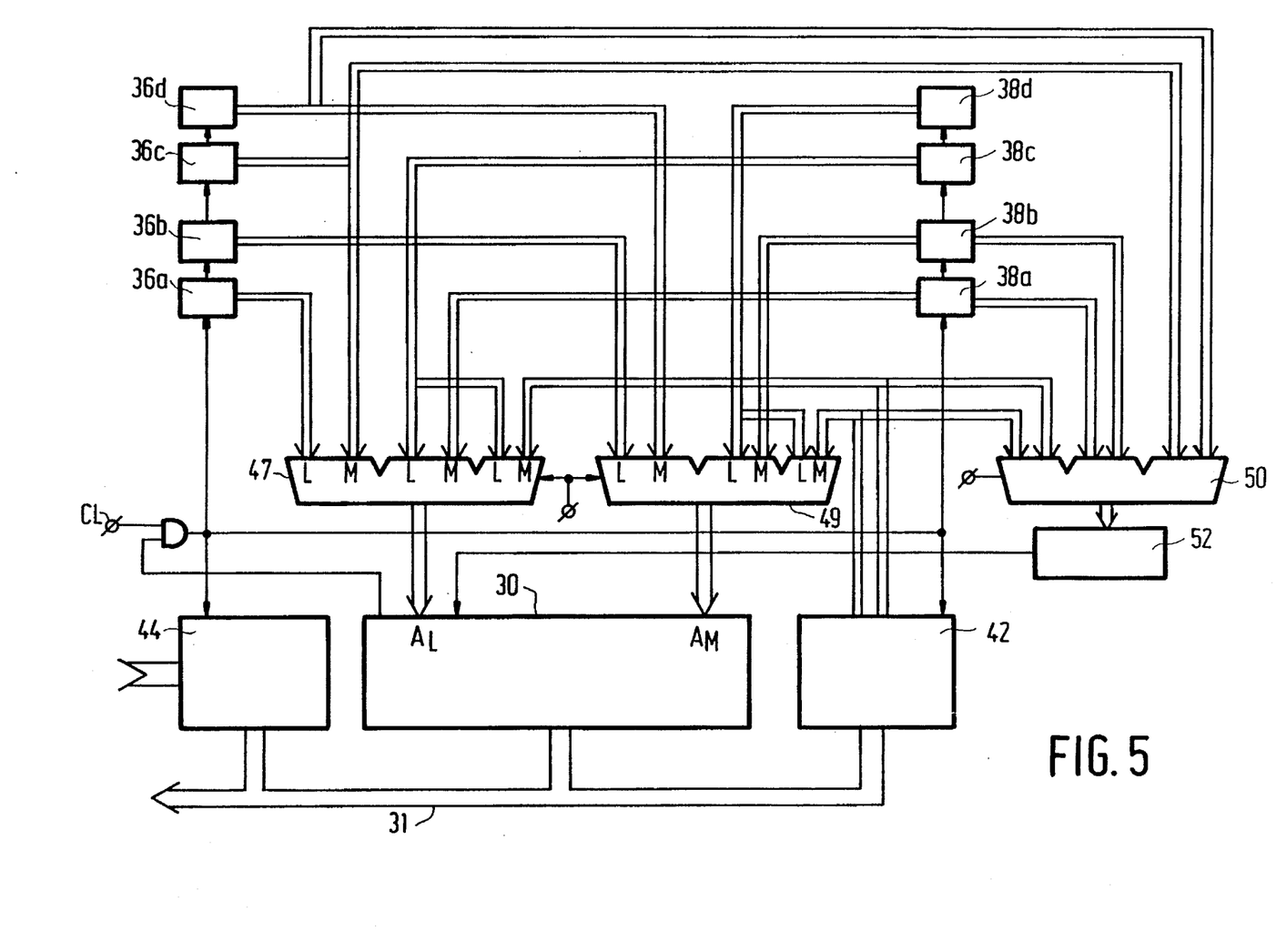
FIG. 5 shows a circuit for rendering the write location dependent on the occurrence of non-correctable errors.

FIG. 5 shows a circuit for rendering the write location dependent on the occurrence of non-correctable errors. This circuit is mainly equivalent to that shown in FIG. 4, be it that a multiplexer 50 and a memory 52 have been added. The count output of the block number counter 36c–d of the first cascade of counters is coupled to the one input of the multiplexer 50; the count output of the intrablock counter 38a–b of the second cascade of counters is coupled to a second input of the multiplexer 50, and the first decoder 42 is coupled to a third input of the multiplexer. The output of the multiplexer is coupled to the address input of the further memory 52. The data output of the further memory 52 is coupled to a part of the address input for the intrapage address of the memory 30.

During operation a signal from the memory 50 is applied, together with the signal from the multiplexer 47, as an intrapage address to the address input AL of the memory 30. This signal from the memory 50 thus enables the selection between two different locations on one page for each data unit arriving. The selection is made on the basis of the incoming block number and is such that the data units of the last error-free version of the block are not erased.

For each incoming block the memory 50 contains a bit which indicates the location to be chosen. If decoding reveals that the incoming block is present in the memory 30 in error-free form, the bit for this block is inverted in the memory 50 by the control unit, so that the block is not erased when the next version of the block is written. If decoding reveals that the incoming block contains an error, the bit for this block is not inverted, so that the block is erased when the next version of the block is written and a previous error-free version is saved.

During the reading and writing by the first decoder 42 (step 14) the selection of the correct location is determined on the basis of the number of the data unit within its second block (on the basis of the count of the counters 36a–b or the corresponding part of the address used by the decoder 42 upon correction). This number corresponds to the number of the first block in which the data unit has arrived and is used as the address for the memory 50.

During the reading of the second blocks, each successive data unit requires a bit from another location in the memory 50. Because the memory 50 provides only a selection between different locations within the same page, the number of page addresses required is not dependent on the values of these bits.

The FIGS. 3, 4 and 5 merely show an embodiment of the invention. For example, the addresses for the memory 30 can also be generated under the control of software. For application of the invention it is then necessary to convert the number of the block NB and of the data unit within the block ND into an address for the memory.

During the storage of the first blocks this can be realised, for example by decomposing these numbers (NB, ND, counting from 0) into an integer quotient (QB, QD, respectively) and a remainder (RB, RD) upon division by the number of blocks L2 wherefrom a part is stored per page and the number of data units L1 of a block which is stored per page, respectively:

$$ND = QD\ L1 + RD$$

$$NB = QB\ L2 + RB$$

The number of blocks L2 wherefrom a part is stored per page is codependent on the number of data units LP that can be fitted on a page and the number of data units L1 of a block stored per page $$L2 = \lfloor LP/L1 \rfloor$$

(which means the largest integer smaller than or equal to LP/L1). The page address AM and the intrapage address AL are then:

$$AL = RB\ L1 + RD$$

$$AM = QB\ L + QD$$

where L is the number of pages among which a block is distributed:

$$L = \lceil LB/L1 \rceil$$

(which means the lowest integer number larger than or equal to LB/L1; LB is the number of data units per block). For the example of FIG. 2a, L1=2, LP=4, L2=2, LB=3, L=2. Thus, for example for the data unit D8 (for which NB=2, ND=1) it follows that QD=0, RD=1, QB=1, RB=0, AL=1, AM=2.

The address of a data unit in a second block then follows from the number of the second block MB, and the number of the data unit in the second block MD. To this end, these numbers (MB, MD) are also decomposed into an integer quotient (PB, PD, respectively) and a remainder (SB, SD) upon division:

$$MD = PD\ L2 + SD$$

$$MB = PB\ L1 + SB$$

The page address AM and the intrapage address AL are then:

$$AL = SD\ L1 + PB$$

$$AM = PD\ L + SB$$

For the example of FIG. 2b and for the data unit C11 (MB=3, MD=1) it holds, for example that PD=0, SD=1, PB=1, SB=1, so that AL=3, AM=1.

On the basis of the page size a coarse estimate can be made of the number of data units to be stored on a page per block so as to minimize the number of page addresses required. (The optimum minimization is determined preferably on the basis of a simulation.) The number of page addresses required for the encoding of the first blocks amounts to approximately N/L1, where N is the total number of data units; the same number of page addresses is required for the writing of the data units. The number of page addresses required for the encoding of the second blocks is approximately N/L2. The total number of page addresses, therefore, amounts to $$2N/L1 + N/L2$$

(L2=LP/L1). This is minimized when L1 is equal to the square root of 2 LP. Upon decoding the optimum page length is approximately the same, be it that the optimum is then also dependent on the number of data units to be corrected and hence on the error chance. If more frequent writing back into the memory is required because of a higher error chance, it is advisable to increase the number of data units of a block to be corrected which are to be stored per page.

When the memory location is rendered dependent on the occurrence of non-correctable errors, only the address AL within the page changes, for example as follows $$AL = RB\ L1 + RD + E(NB)$$

$$AL = SD\ L1 + PB + E(MD)$$

where E=0 or L1*L2, depending on the location of the last error-free version of the block.

It will be evident from the foregoing that the time required to encode and decode data units can be reduced by writing incoming data units of a code block so that they are distributed in groups among different pages.

It will also be evident that the invention is not restricted to the embodiments described. For example, it is not necessary to proceed in three steps (as shown in FIG. 1). It is also possible to provide incoming data units with parity symbols already during the first step, followed by writing in the memory, and to despatch the data units read during the second step together with the parity symbols thus formed. In this case the transmission sequence will not correspond to the write sequence. This may be a drawback if it is desirable to keep a burst error local during decoding.

It will also be evident that the write sequences shown in FIGS. 2a–c serve merely as an example and that, without departing from the scope of the invention, other sequences can also be used where each block is written and read so as to be distributed in parts among several pages.

Moreover, the invention has been explained merely with reference to product codes, but it can be used equally well for other codes such as pseudo-product codes or convolution codes (in which case each time only a part of the data units, for example only one first block, in the memory is replaced before a second block is formed or corrected again). Each data unit then again forms part of a first code block and of a second block, data units which are present together in one and the same first code block not being present together in one and the same second code block. (A data unit is not necessarily identical to a symbol in the sense of the encoding theory, but may also comprise, for example several symbols; different data units in a block may even consist of different numbers of symbols, for example when the block contains an odd number of symbols and each data unit but one consists of two symbols.)

As has already been described, the encoded second blocks can be despatched after formation, for example so as to be stored on a magnetic tape. The first blocks to be decoded can be received, for example from a tape. It is to be noted that the term "block" is not necessarily to be understood to mean that all data units are despatched or received physically together. For example, without departing from the scope of the invention, data units containing parity symbols may be transmitted or received, for example separate from the other data units.

I claim:

1. An encoding device, comprising a first encoder for forming respective first blocks in a first error protection code, a memory for the storage of data units of the first blocks, the memory being page oriented where successive accessing of different locations in a same page require only a single page addressing operation, read means for reading a sub-set of the data units, comprising one data unit from each first block, from the memory, and a second encoder for forming a second block in a second error protection code by encoding the sub-set, and the encoding device being arranged for writing data units of a particular first block in the memory distributed among several pages, with at least two data units of the particular first block being written on one and the same page at different addresses within the same page on the basis of a first, single page addressing operation, and writing further data units of further first blocks also distributed among the several pages, and the read means being arranged for reading the data units of the sub-set successively from different pages, at least two data units then being read on the basis of a second, single page addressing operation.

2. A decoding device, comprising a first decoder for decoding/correcting respective first blocks in accordance with a first error correction code, a memory for the storage of data units of the first blocks, the memory being page oriented where successive accessing of different locations in a same page require only a single page addressing operation, read means for reading a sub-set of the data units, comprising one data unit from each first block, from the memory, and a second decoder for decoding/correcting the subset in accordance with a second error correction code, and the encoding device being arranged for writing data units of a particular first block in the memory distributed among several pages, at least two data units of the particular first block being written on one and the same page at different addresses within the same page on the basis of a first, single page addressing operation, and writing further data units of further first blocks also distributed among the several pages, and the read means being arranged for reading the data units of the sub-set successively from different pages, at least two data units then being read on the basis of a second, single page addressing operation.

3. An encoding claimed in claim 1, wherein the at least two data units read by the read means on the basis of a second, single page addressing operation are associated at least with a first and a second one of the first blocks, respectively, and the read means are arranged to read a further sub-set which is disjunct with the sub-set and contains one data unit from each first block, at least two further data units from at least the first and the second one of the first blocks, respectively, being read on the basis of said second, single page addressing operation, the second encoder being arranged to encode the sub-set, respectively, according to a second error correction code.

4. An encoding device as claimed in claim 3, wherein it is arranged to leave the first one of the first blocks essentially unchanged between the reading of the sub-set and of the further sub-set and to replace the data units of the second one of the first blocks on the page addressed by the second page address by data units of a newly formed first block.

5. An encoding device as claimed in claim 1, further comprising write means provided with first and second counting means for counting a first block number and a data unit number, respectively, of a data unit to be written within a first block, least-significant parts of counts of the first and the second counting means serving together as an intrapage address and most-significant parts of the counts serving together as a page address for the memory.

6. An encoding device as claimed in claim 1, wherein the read means comprise first and second counting means for counting a second block number and a data unit number, respectively, of a data unit to be read in a second block, least-significant parts of counts of the first and the second counting means serving together as a page address, and most-significant parts of the counts serving together as an intrapage address for the memory.

7. A decoding device as claimed in claim 2, wherein it is arranged to make a selection between a first location and a second location on the same page in order to write each data unit of each first block, so that a last preceding, error-free, corresponding first block remains accessible in the first or the second location.

8. A device, comprising:

a first encoder for forming respective first blocks in a first error protection code, a connection for a page memory for the storage of data units of the first blocks, read means for reading a sub-set of the data units, comprising one data unit from each first block, from the memory, a second encoder for forming a second block in a second error protection code by encoding the sub-set in accordance with a second error correction code, and a control device arranged for controlling writing data units of a particular first block in the memory distributed among several pages, at least two data units of the particular first block being written at different addresses on one and the same page on the basis of a first, single page addressing operation, writing further data units of further first blocks distributed among the several pages, and arranged for controlling the read means for reading the data units of the sub-set successively from different pages, at least two data units then being read on the basis of a second, single page addressing operation.

9. A decoding device as claimed in claim 2, wherein the at least two data units read by the read means on the basis of a second, single page addressing operation are associated at least with a first and a second one of the first blocks, respectively, the read means are arranged to read a further sub-set which is disjunct with the sub-set and contains one data unit from each first block, at least two further data units from at least the first and the second one of the first blocks, respectively, being read on the basis of said second, single page addressing operation, the second decoder being arranged to decode the sub-set, respectively, according to a second error correction code.

10. A decoding device as claimed in claim 9, wherein it is arranged to leave the first one of the first blocks essentially unchanged between the reading of the sub-set and of the further sub-set and to replace the data units of the second one of the first blocks on the page addressed by the second page address by data units of a newly formed first block.

11. A decoding device as claimed in claim 2, further comprising write means provided with first and second counting means for counting a first block number and a data unit number, respectively, of a data unit to be written within a first block, least-significant parts of counts of the first and the second counting means serving together as an intrapage address and most-significant parts of the counts serving together as a page address for the memory.

12. A decoding device as claimed in claim 2, wherein the read means comprise first and second counting means for counting a second block number and a data unit number, respectively, of a data unit to be read in a second block, least-significant parts of counts of the first and the second counting means serving together as a page address, and most-significant parts of the counts serving together as an intrapage address for the memory.

13. A device, comprising:

a decoder for decoding/correcting respective first blocks in a first error protection code, a connection for a page memory for the storage of data units of the first blocks, read means for reading a sub-set of the data units, comprising one data unit from each first block, from the memory, a second decoder for forming a second block in a second error protection code by decoding/correcting the subset in accordance with a second error correction code, and a control device being arranged for controlling writing data units of a particular first block in the memory distributed among several parts, at least two data units of the particular first block being written at different addresses on one and the same page on the basis of a first, single page addressing operation, writing further data units of further first blocks distributed among the several pages, and arranged controlling the read means for reading the data units of the sub-set successively from different pages, at least two data units then being read on the basis of a second, single page addressing operation.

\* \* \* \* \*